United States Patent [19]

Hutson

[11] 4,063,278
[45] Dec. 13, 1977

[54] SEMICONDUCTOR SWITCH HAVING SENSITIVE GATE CHARACTERISTICS AT HIGH TEMPERATURES

[76] Inventor: Jearld L. Hutson, 2019 W. Valley View Lane, Dallas, Tex. 75234

[21] Appl. No.: 767,078

[22] Filed: Feb. 9, 1977

Related U.S. Application Data

[63] Continuation of Ser. No. 538,917, Jan. 6, 1975, abandoned.

[51] Int. Cl.² ............................................. H01L 29/74
[52] U.S. Cl. ......................................... 357/38; 357/12; 357/55; 357/86
[58] Field of Search .................... 357/20, 38, 39, 55, 357/86, 12

[56] References Cited

U.S. PATENT DOCUMENTS

| | | | |
|---|---|---|---|
| 3,360,696 | 12/1967 | Neilson et al. | 357/39 |
| 3,391,310 | 7/1968 | Gentry | 357/39 |
| 3,489,962 | 1/1970 | McIntyre et al. | 357/38 |
| 3,681,667 | 8/1972 | Kokosa | 357/38 |

*Primary Examiner*—Stanley D. Miller, Jr.
*Assistant Examiner*—Joseph E. Clawson, Jr.
*Attorney, Agent, or Firm*—Richards, Harris & Medlock

[57] ABSTRACT

The specification discloses a sensitive gate controlled rectifier including a semiconductor body having four layers of alternating opposite conductivity types. A first highly doped region of a first conductivity type is formed in a first exterior layer of the body of the first conductivity type. A second highly doped region of a second conductivity type is formed in the first exterior layer adjacent the first region. A first electrode electrically connects an internal layer of the second conductivity type with the first exterior layer and the first region to form a cathode. A second electrode connects to the second region to form a gate. A third electrode connects to a second exterior layer of the second conductivity type to form an anode.

5 Claims, 8 Drawing Figures

SEMICONDUCTOR SWITCH HAVING SENSITIVE GATE CHARACTERISTICS AT HIGH TEMPERATURES

This is a continuation of application Ser. No. 538,917, filed Jan. 6, 1975, now abandoned.

FIELD OF THE INVENTION

This invention relates to semiconductor switches, and more particularly relates to a silicon controlled rectifier having improved sensitive gate characteristics.

THE PRIOR ART

Asymmetrical regenerative semiconductor switching devices are currently used for a wide variety of electronic control applications. Particularly useful is the silicon controlled rectifier (SCR) which has four regions of alternate electrical conductivity types to provide switching in a single direction. The construction and operation of such controlled rectifier devices is described in Chapter 1 of the *General Electric Controlled Rectifier Manual,* 2nd Edition, Copyright 1961, by the General Electric Company and in an article by Mol, Tannenbaum, Goldey and Holonyak in the "Proceeding of the I.R.E.," Sept. 1956, Vol. 44, Pages 1174–1182.

It has, however, been heretofore difficult to manufacture conventional SCRs that have very sensitive gate turn-on characteristics and which also have excellent operating characteristics in other respects. Generally, a sensitive gate turn-on device is defined as an SCR which will switch by means of regeneration from its nonconductive to its conductive state upon the application to the gate electrode of a current less than 500 microamperes. A parameter which primarily affects the gating or turn-on characteristics of an SCR is the amount of leakage current which flows across the surface exposed junctions of the device. Such leakage current reduces the sensitivity of turn-on of the device, as the leakage current itself tends to cause the device to become regenerative and switch. Thus, leakage current becomes a substantial factor in the control of switching of SCRs, especially at higher operating temperatures.

Improvements have thus been heretofore made to SCRs in order to provide sensitive gate characteristics at high temperatures. For example, inversion layers have been formed in order to shunt leakage currents around surface exposed junctions, so as to minimize or eliminate any contribution of the leakage currents to regeneration or switching. Such devices are described in U.S. Pat. No. 3,524,114, issued on Aug. 11, 1970 to the present applicant. In addition, external resistances have often been required to be tied across SCRs in order to prevent turn-on of the device at high temperatures.

SUMMARY OF THE INVENTION

In accordance with the present invention, a semiconductor switch includes a semiconductor body having a plurality of interleaved layers of alternating opposite conductivity type to form a plurality of P-N junctions. A first highly doped region of a first conductivity type is formed in an exterior layer of the body having a first conductivity type. Structure provides a path of low ohmic resistance between the first region and an internal layer of a second conductivity type. A second highly doped region of the second conductivity type is formed in the exterior layer. Electrodes contact the regions and an exterior layer of the second conductivity type to form a semiconductor switch having sensitive gate characteristics at high temperatures.

In accordance with another aspect of the invention, a sensitive gate controlled rectifier includes a semiconductor body having four layers of alternating first and second opposite conductivity types. A first highly doped region of a first conductivity type is formed in a first exterior layer of the body of the first conductivity type. A second highly doped region of a second conductivity type is formed in the first exterior layer adjacent the first region. A first electrode electrically connects an internal layer of the second conductivity type with the first exterior layer and the first region. A second electrode connects to the second region. A third electrode connects to a second exterior layer of the second conductivity type.

DESCRIPTION OF THE DRAWINGS

For a more complete understanding of the present invention and for further objects and advantages thereof, reference is now made to the following description, taken in conjunction with the accompanying drawings, in which.

DESCRIPTION OF THE PREFERRED EMBODIMENT

Figure 1:
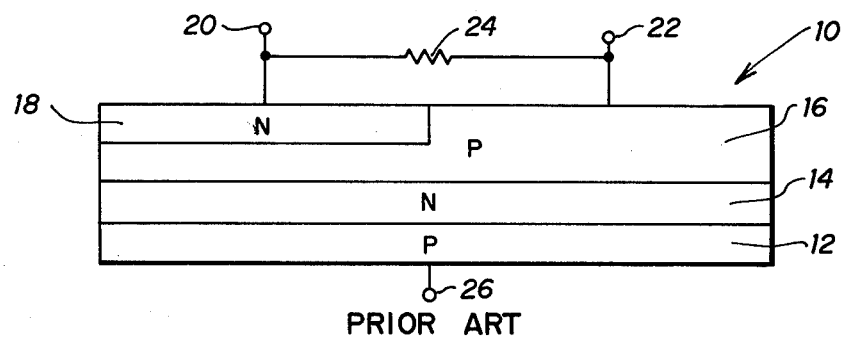
FIG. 1 is a somewhat diagrammatic illustration of a prior art four layer SCR.
Figure 2:
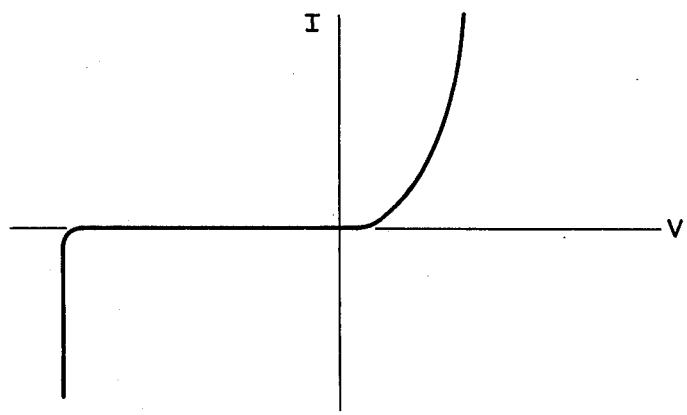
FIG. 2 is a graphical illustration of the current-voltage characteristics of a typical SCR.

FIG. 1 illustrates a prior art SCR or thyristor device which is designated generally by the numeral 10. Device 10 includes a P layer 12, an N layer 14 and a P layer 16. An N region 18 is formed by diffusion or the like into the P layer 16. An electrode 20 contacts N region 18, while an electrode 22 contacts layer 16. A resistance 24 is tied across electrodes 20 and 22 in order to provide a path for leakage current, while enabling operation of the device 10 as a sensitive gate SCR. A third electrode 26 is connected to the P-type layer 12. Operation of the SCR is well known, with FIG. 2 illustrating the resulting current verses voltage switching operation at the junction between P-type layer 16 and N-type region 18. Provision of the resistance 24 not only increases the manufacturing difficulty and adds to the bulkiness of the device, but also tends to affect certain operating characteristics of the device.

Figure 3:
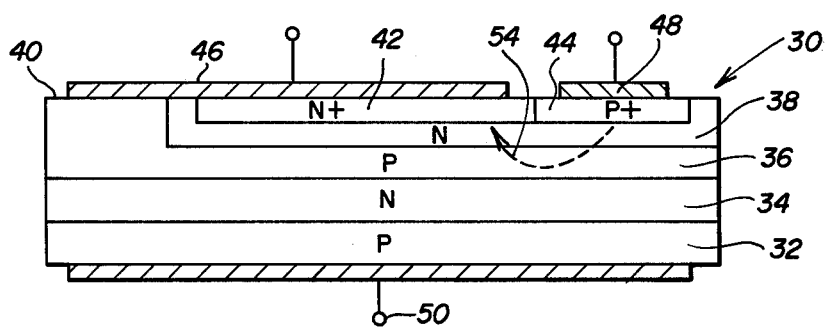
FIG. 3 is a sectional view taken generally along the section lines 3—3 of the present invention in FIG. 4.

FIG. 3 illustrates a preferred embodiment of the present invention, wherein very sensitive gate performance is provided even at high temperatures, without requirement of an external resistance as shown in FIG. 1. Referring to FIG. 3, a body of semiconductor material 30 includes a layer 32 of P-type material, with an N-type layer 34 being interleaved between layer 32 and a second P-type layer 36. A fourth layer 38 of N-type material is formed by diffusion or any other suitable method in layer 36. A portion of P-type layer 36 extends outwardly to external surface 40.

A first region 42 of highly doped N-type material is formed in layer 38, adjacent a second region 44 of highly doped P-type material. A first electrode 46 shorts the exposed surface 40 of the p-type layer 36 with the exposed surface of N-type layer 38 and the N+ region 42. A second electrode 48 contacts the P+ region 44. A third electrode 50 contacts the P-type layer 32.

Figure 4:
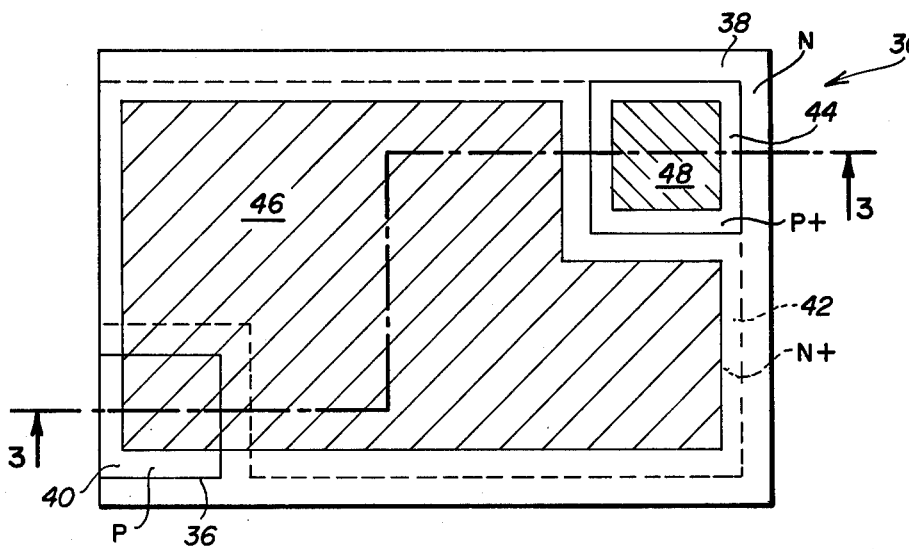
FIG. 4 is a somewhat diagrammatic top view of the preferred embodiment of the invention.

FIG. 4 illustrates a top view of body 30 and illustrates the N-type layer 38 and the formation of the rectangular P+ region 44 in the upper righthand corner thereof. The N+ region 42 is illustrated by the dotted line as overlaying a large portion of the body 30, while the exposed surface 40 of the P-type layer 36 is illustrated as a small rectangular portion in the lower lefthand corner of the body 30. Electrode 48 is seen to contact the P+ region 44, while the electrode 46 covers a large portion of the remainder of the device.

It will be understood that the construction of the device shown in FIGS. 3 and 4 may be accomplished by any of a large number of commonly utilized fabrication techniques, and it will thus not be discussed here in detail. For example, an N-type conductivity silicon wafer may be diffused on both sides in various steps to form the four layers 32–38. The N+ and P+ regions 42 and 44 may then be formed in layer 38 by conventional diffusion techniques using suitable dopants or impurities which are compatible with the particular semiconductor material being operated upon. The particular size and shape of the diffused regions are of course determined by suitable masking and photographic techniques conventionally employed in semiconductor diffusion technology. It will be understood that any suitable semiconductor material may be utilized to form devices according to the invention, but for clarity of illustration, reference is made in the drawings to particular electrical conductivity types and silicon as the material being utilized. It will, of course, be understood that the electrical conductivity types herein specified may be interchanged and reversed.

The N and P layers may be provided with impurity concentrations according to conventional ranges. The N+ region may be provided with an impurity concentration of conventional levels such a approximately $10^{21}$ or greater, while the P+ region 44 may be provided with an impurity concentration of conventional levels such as between $10^{19}$ and $10^{21}$.

In the operation of the device illustrated in FIGS. 3 and 4, when it is desired to place the device in the conductive state, a negative voltage is applied to electrode 46, which comprises the SCR cathode. A positive low level gate voltage is applied to electrode 48 which serves as the SCR gate. A positive voltage relative to the voltage applied to the cathode is applied to electrode 50 which serves as the SCR anode.

This bias condition causes holes to be emitted by the P+ gate region 44. The holes are emitted across the forward biased junction between the region 44 and layer 38 into the N-type layer 38. Some holes cross the junction between N-type layer 38 and P-type layer 36, but are repelled back into the N-type region 38 due to the fact that the P-N junction between layers 34 and 36 is reverse biased. The resulting path of the hole current is illustrated by the dotted line 54. This emission of holes by the gate causes current flow across the junction between N-type layer 38 and the P-type layer 36, and thus causes regenerative action to cause the entire switching device to become conductive. In this conductive or "on" condition of the device, the interior layers of the device are saturated with carriers, thereby providing all interior P-N junctions with forward biases. The resulting voltage-current characteristic taken across the gate and cathode of the device shown in FIGS. 3 and 4 may be illustrated by the V-I curve shown in FIG. 2. The present device thus provides performance characteristics similar to that of conventional SCRs, except that the present device switches at much lower gate currents than prior SCRs and remains stable at high temperatures.

Figure 5:
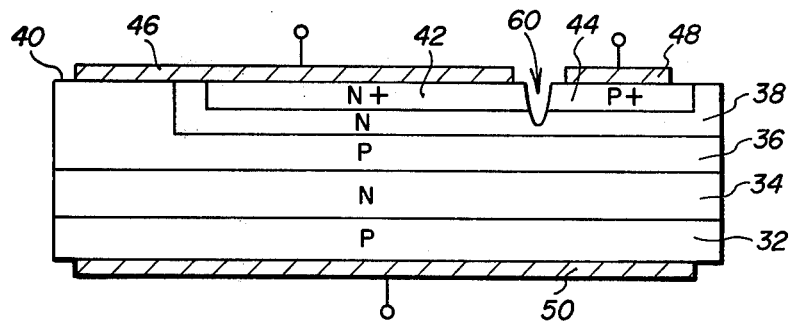
FIG. 5 is a sectional view of a second embodiment of the invention.

FIG. 5 illustrates a second embodiment of the present device, with like numerals being utilized for like and corresponding parts. The device shown in FIG. 5 may thus be seen to be identical with the device shown in FIG. 3, with the exception that a groove 60 is formed between the N+ region 42 and the P+ region 44 in order to provide isolation therebetween. Groove 60 extends about the rectangular region 44 in the top view shown in FIG. 4. The device shown in FIG. 5 operates in substantially the same manner as that previously described with respect to FIGS. 3 and 4.

Figure 6:
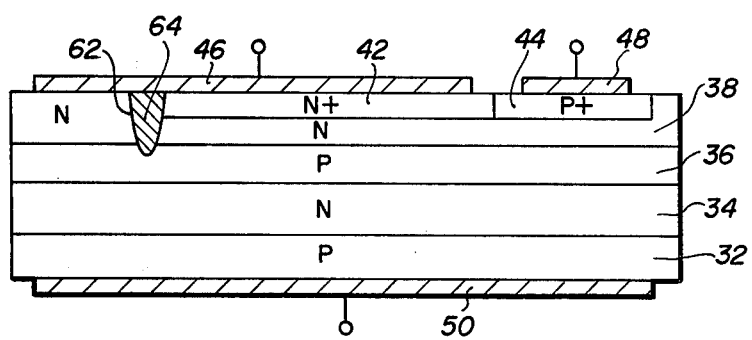
FIG. 6 is a sectional view of a third embodiment of the present invention.

FIG. 6 illustrates yet another embodiment of the present invention, with like numerals being utilized for like and corresponding parts. In this embodiment, the N-type layer 38 extends completely over the P-type layer 36. A groove 62 is formed through the N-type layer 38 and into contact with the P-type layer 36. Groove 62 is then filled with a conductive material 64, such as metal, which contacts the N-type layer 38, the P-type layer 36 and the N+ region 42. The metal portion 64 also contacts the electrode 46 in order to provide a low ohmic resistance path from the P-type layer 36 to the electrode 46. Operation of the device shown in FIG. 6 remains similar to that explained with respect to the device shown in FIGS. 3 and 4.

Figure 7:
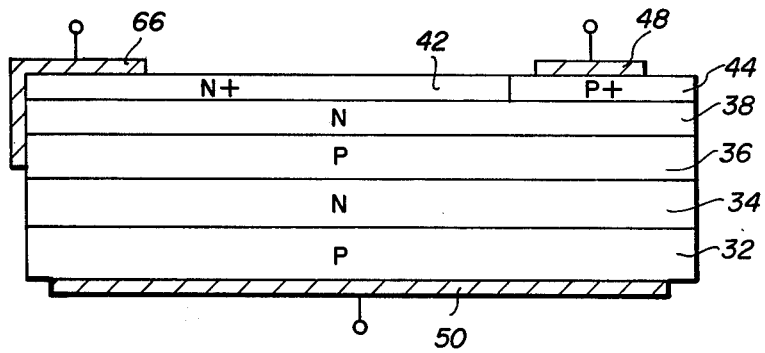
FIG. 7 is a sectional view of a fourth embodiment of the present invention.

FIG. 7 illustrates a fourth embodiment of the invention, with like numerals being utilized for like and corresponding parts previously described. In this embodiment, the N-type layer 38 extends completely over layer 36 and the N+ region 42 and P+ region 44 extend completely over the N-type layer 38. An electrode 66 extends into contact with the P-type layer 36, the N-type layer 38 and the N+ region 42 in order to provide a low ohmic resistance path between these regions of the device. Operation of the device shown in FIG. 7 is similar to that previously described.

Figure 8:
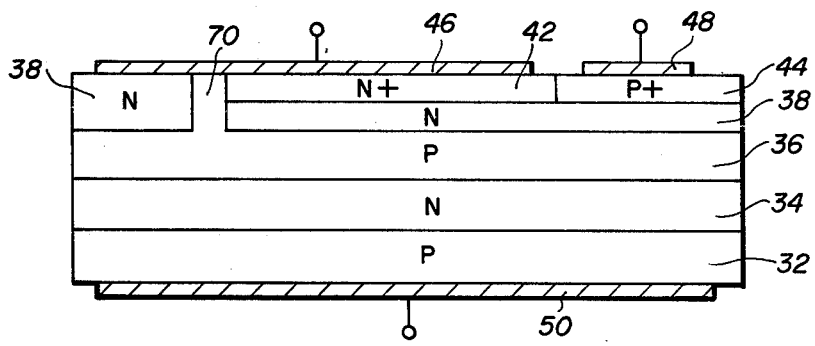
FIG. 8 is a sectional view of a fifth embodiment of the present invention.

FIG. 8 illustrates a fifth embodiment of the present invention, which includes an upward extension 70 of P-type material which extends from the P-type layer 36 to the outer exterior surface of the semiconductor body. The extension 70 extends through the N-type layer 38 which otherwise extends completely over one surface of the P-type layer 36. The extension 70 of P-type material contacts the electrode 46 to thereby provide a low ohmic resistance path between the P-type layer 36, the N-type layer 38 and the N+ region 42.

It will thus be seen that the present invention provides an improved asynchronous semiconductor switching device which provides a very sensitive gate turn-on characteristic in high temperature environments. Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A sensitive emitter gate silicon controlled rectifier comprising:
   a semiconductor body having at least four layers of alternating first and second opposite conductivity types,
   a first highly doped region of a first conductivity type formed in a first exterior layer of said body of said first conductivity type,
   a second highly doped region of a second conductivity type having an area less than the area of said first region formed in said first exterior layer adjacent said first region, said second region acting as an emitting gate to emit carriers to cause regenerative switching of said rectifier during operation,
   a first electrode forming a cathode for electrically connecting an internal layer of said second conductivity type with said first exterior layer and said first region in order to provide a low ohmic resistance path therebetween,
   a second electrode contacting said second region to form a gate, and
   a third electrode forming an anode for contacting only a second exterior layer on the opposite side of said body from said first exterior layer and formed from said second conductivity type, wherein said rectifier may be rendered conductive by a very low level gate signal applied to said gate.

2. The rectifier of claim 1 and further comprising a groove separating said first and second regions.

3. The rectifier of claim 1 wherein said first region is contiguous to said second region, said second region is coterminous with one edge of said body, and said low ohmic resistance path is provided by said first electrode contacting a second edge of said body spaced from said one edge by said first region wherein said second edge contacted by said first electrode includes exposed surface areas of said first region and internal layers of said first and second conductivity types.

4. The rectifier of claim 1 wherein said first region is contiguous to said second region and said low ohmic path is provided by an extension of said internal layer of said second conductivity type extending through said first exterior layer into contact with said first electrode at a point located between a region of said exterior layer of said first conductivity type and said first region.

5. The rectifier of claim 1 wherein said first region is contiguous to said second region and said low ohmic path is provided by a groove filled with conductive material extending from said first electrode through said external layer of said first conductivity type into said internal layer of said second conductivity type.

* * * * *